(12) United States Patent
Takeuchi

(10) Patent No.: US 11,245,357 B2
(45) Date of Patent: Feb. 8, 2022

(54) VIBRATION DEVICE

(71) Applicant: SEIKO EPSON CORPORATION, Tokyo (JP)

(72) Inventor: Junichi Takeuchi, Chino (JP)

(73) Assignee: SEIKO EPSON CORPORATION, Tokyo (JP)

(*) Notice: Subject to any disclaimer, the term of this patent is extended or adjusted under 35 U.S.C. 154(b) by 0 days.

(21) Appl. No.: 17/081,268

(22) Filed: Oct. 27, 2020

(65) Prior Publication Data

US 2021/0126583 A1  Apr. 29, 2021

(30) Foreign Application Priority Data

Oct. 29, 2019 (JP) .............................. JP2019-196697

(51) Int. Cl.
| | | |
|---|---|---|
| *H03B 5/04* | (2006.01) | |
| *H01L 23/34* | (2006.01) | |
| *H03B 5/36* | (2006.01) | |
| *H03H 9/10* | (2006.01) | |
| *H03H 9/02* | (2006.01) | |
| *H03H 9/05* | (2006.01) | |
| *H03H 9/08* | (2006.01) | |

(52) U.S. Cl.
CPC ............. *H03B 5/04* (2013.01); *H01L 23/345* (2013.01); *H03B 5/36* (2013.01); *H03H 9/02102* (2013.01); *H03H 9/0557* (2013.01); *H03H 9/08* (2013.01); *H03H 9/1021* (2013.01)

(58) Field of Classification Search
CPC .......... H03B 5/36; H03B 5/04; H01L 23/345; H03H 9/0557; H03H 9/08; H03H 9/02102; H03H 9/1021; H03H 9/19

USPC ..... 368/47; 331/158, 176, 68; 310/344, 341, 310/343

See application file for complete search history.

(56) References Cited

U.S. PATENT DOCUMENTS

| | | | |
|---|---|---|---|
| 2012/0139648 A1 | 6/2012 | Asamura et al. | |
| 2012/0243384 A1* | 9/2012 | Funabiki ................ | G04R 20/10 368/47 |

FOREIGN PATENT DOCUMENTS

| | | |
|---|---|---|
| JP | 06-232631 | 8/1994 |
| JP | 2012-124549 | 6/2012 |
| JP | 2014-236452 | 12/2014 |
| JP | 2015-005882 | 1/2015 |
| JP | 2015-005883 | 1/2015 |
| JP | 2015-033065 | 2/2015 |
| JP | 2015-088660 | 5/2015 |
| JP | 2016-105572 | 6/2016 |

* cited by examiner

*Primary Examiner* — Arnold M Kinkead
(74) *Attorney, Agent, or Firm* — Rankin, Hill & Clark LLP

(57) ABSTRACT

A vibration device has a substrate including a first surface and a second surface located on an opposite side to the first surface, a heater provided on the first surface side of the substrate, a temperature sensor provided on the first surface side of the substrate, a vibration element disposed on the first surface side of the substrate, a lid including a third surface joined on the first surface side and a fourth surface located on an opposite side to the third surface, and a circuit provided on one of the first surface, the second surface and the fourth surface, and including a temperature control circuit configured to control the heater based on an output of the temperature sensor.

7 Claims, 10 Drawing Sheets

VIBRATION DEVICE

The present application is based on, and claims priority from JP Application Serial Number 2019-196697, filed Oct. 29, 2019, the disclosure of which is hereby incorporated by reference herein in its entirety.

BACKGROUND

1. Technical Field

The present disclosure relates to a vibration device.

2. Related Art

A quartz crystal vibrator that is disclosed in JP-A-2015-33065 has a base board that has a recess, an IC (Integrated Circuit) board that is fixed to a bottom surface of the recess, a vibration element that is fixed to an upper surface of the IC board via a conductive adhesive, and a lid that is joined to the base board so as to close an opening of the recess. Also, a temperature sensor for detecting the temperature of the vibration element and a heater circuit for heating the vibration element are disposed on the upper surface of the IC board, and are controlled so as to maintain a constant temperature within the package of the quartz crystal vibrator.

However, in a quartz crystal vibrator having such a configuration, the IC board which is formed separately from the base board is fixed to the bottom surface of the recess of the base board, thus increasing the size of the vibration device.

SUMMARY

An advantage of some aspects of the present disclosure is to provide a vibration device having a substrate provided with a first surface and a second surface located on an opposite side to the first surface, a heater provided on the first surface side of the substrate, a temperature sensor provided on the first surface side of the substrate, an vibration element disposed on the first surface side of the substrate, a lid provided with a third surface joined on the first surface side, and a fourth surface located on an opposite side to the third surface, and a circuit provided on one of the first surface, the second surface and the fourth surface, and including a temperature control circuit configured to control the heater based on an output of the temperature sensor.

According to another aspect of the disclosure, the circuit may be provided on the fourth surface, and the lid may have a first through electrode passing through the third surface and the fourth surface, and electrically connecting the heater and the circuit, and a second through electrode passing through the third surface and the fourth surface, and electrically connecting the temperature sensor and the circuit.

According to a further aspect of the disclosure, the circuit may have an oscillation circuit, and the lid may have a third through electrode passing through the third surface and the fourth surface, and electrically connecting the vibration element and the circuit.

According to a still further aspect of the disclosure, the vibration device may include an insulating layer provided on the fourth surface side of the lid, and covering the circuit.

According to a still further aspect of the disclosure, the circuit may be provided on the second surface, and the substrate may have a first through electrode passing through the first surface and the second surface, and electrically connecting the heater and the circuit, and a second through electrode passing through the first surface and the second surface, and electrically connecting the temperature sensor and the circuit.

According to a still further aspect of the disclosure, the circuit may have an oscillation circuit, and the substrate may have a third through electrode passing through the first surface and the second surface, and electrically connecting the vibration element and the circuit.

According to a still further aspect of the disclosure, the vibration device may include an insulating layer provided on the second surface side of the substrate, and covering the circuit.

According to a still further aspect of the disclosure, the lid may have a recess opening in the third surface, and housing the vibration element on an inner side thereof, and a thermal insulation layer disposed on an inner surface of the recess.

According to a still further aspect of the disclosure, the circuit may include a temperature compensation circuit configured to perform temperature compensation of an oscillation signal from the oscillation circuit based on the output of the temperature sensor.

BRIEF DESCRIPTION OF THE DRAWINGS

The disclosure will be described with reference to the accompanying drawings, wherein like numbers reference like elements.

DESCRIPTION OF EXEMPLARY EMBODIMENTS

Hereinafter, a vibration device according to this application example will be described in detail based on embodiments illustrated in the accompanying drawings.

First Embodiment

Figure 1:
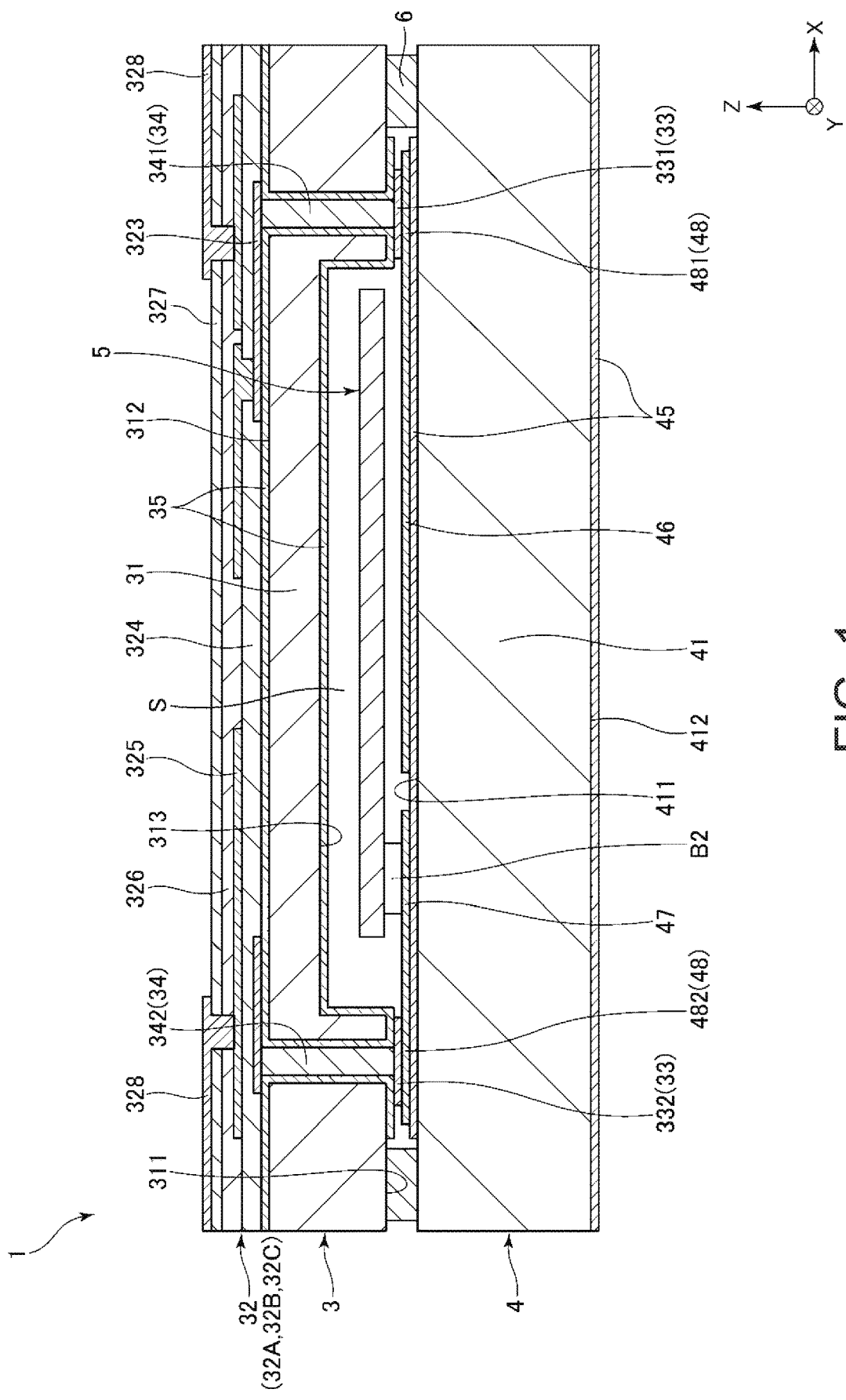
FIG. 1 is a cross-sectional view showing a vibration device according to a first embodiment.
Figure 2:
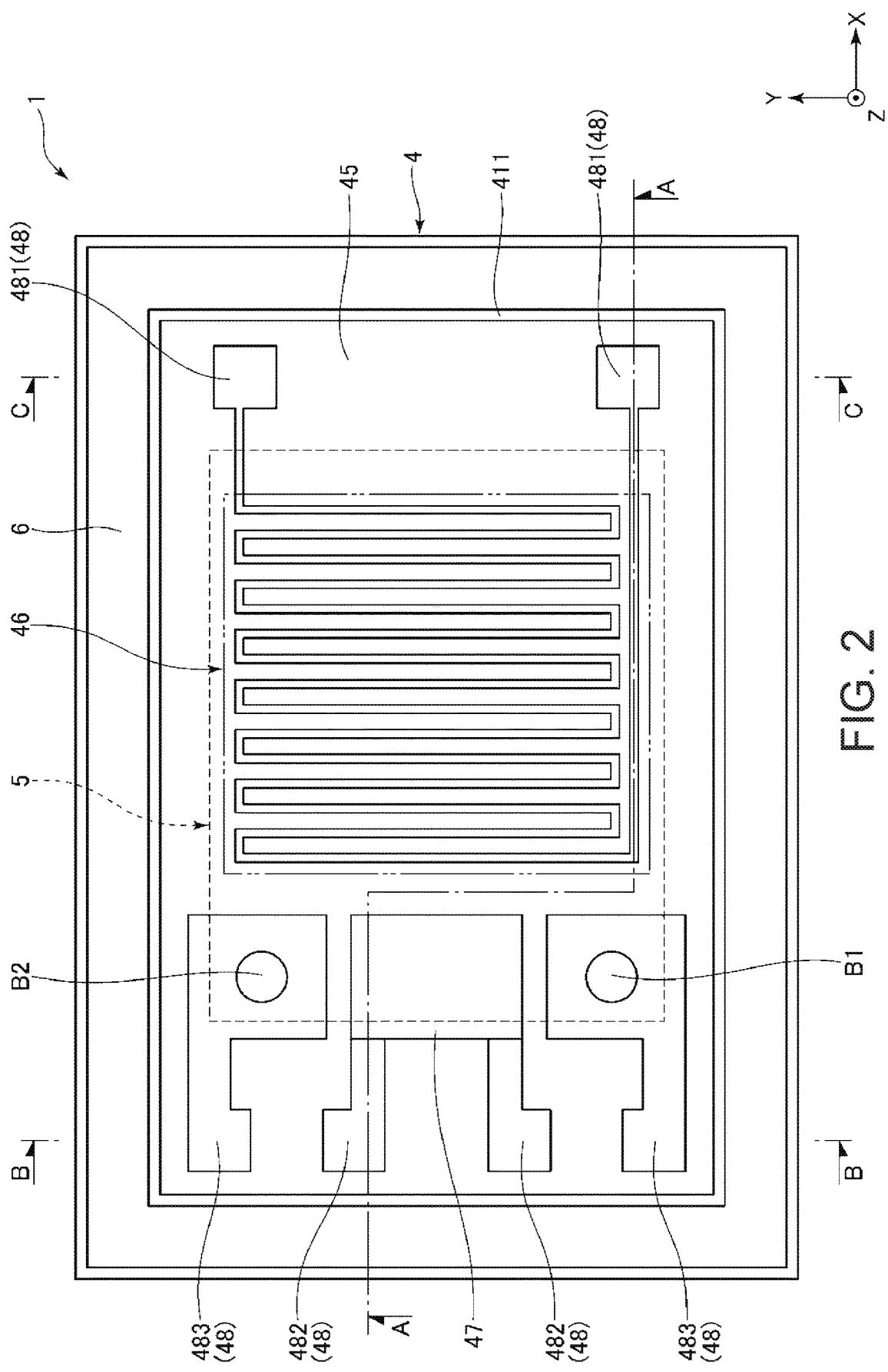
FIG. 2 is a plan view showing a base.
Figure 3:
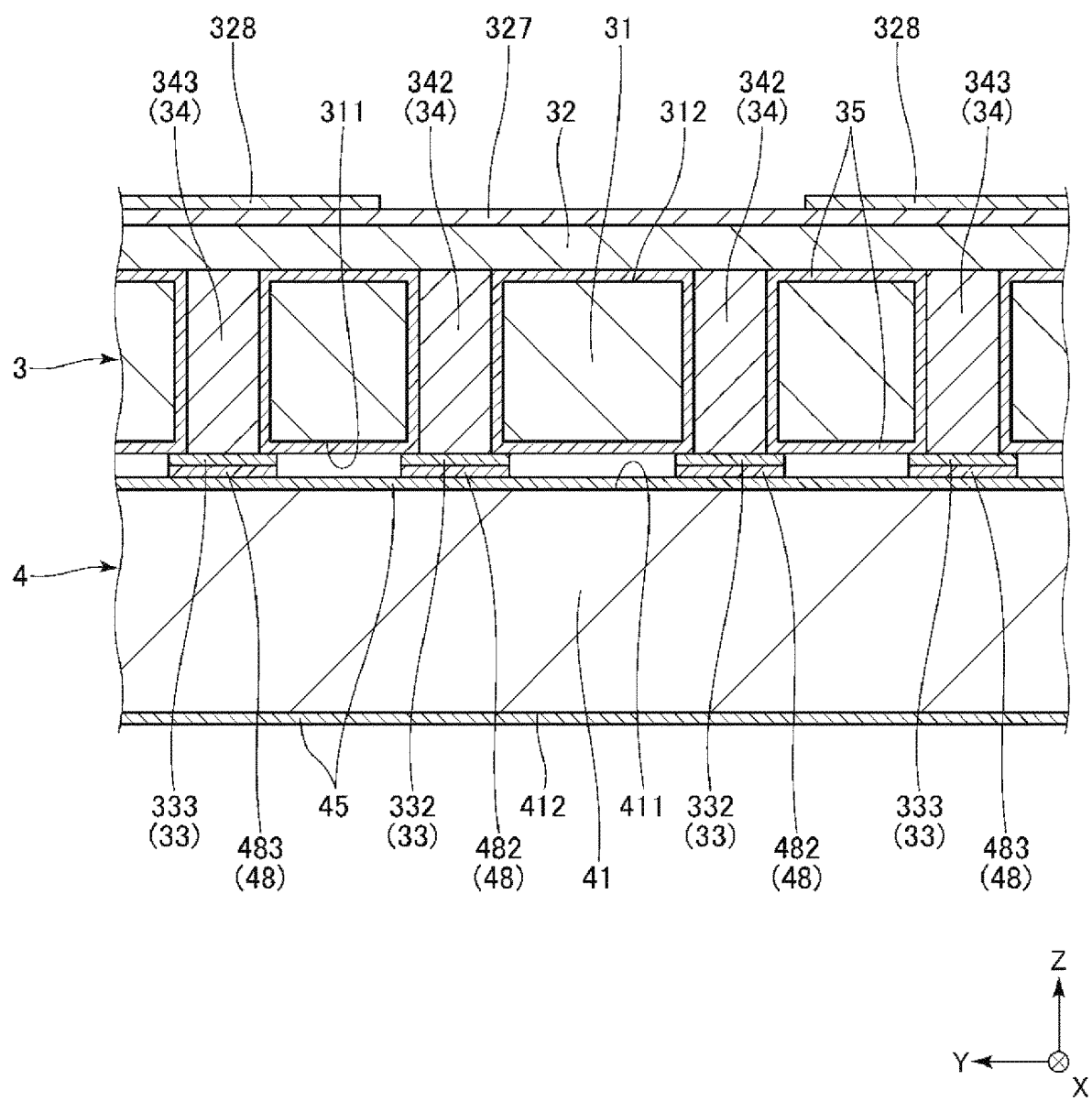
FIG. 3 is a cross-sectional view along line B-B in FIG. 2.
Figure 4:
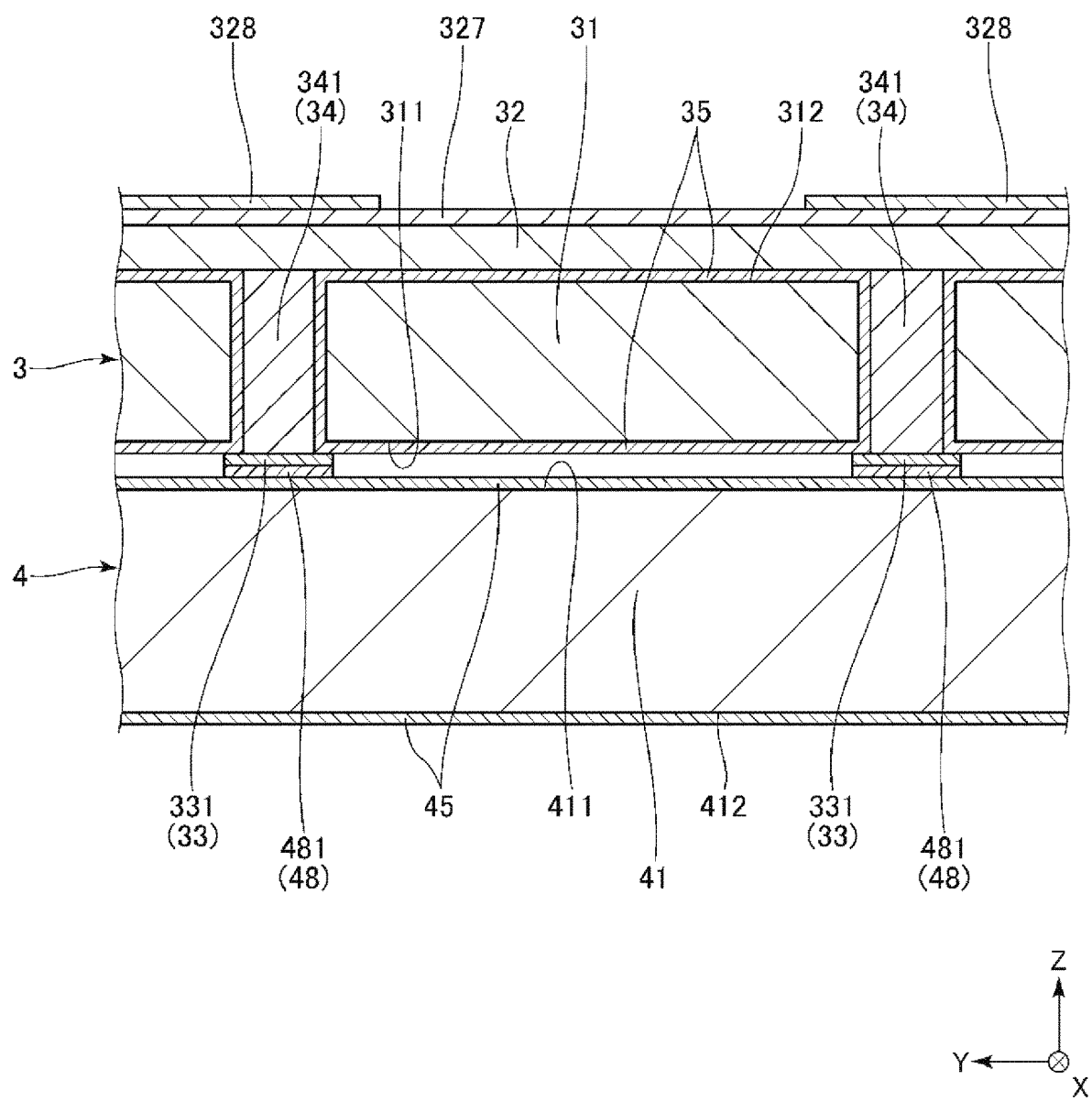
FIG. 4 is a cross-sectional view along line C-C in FIG. 2.
Figure 5:
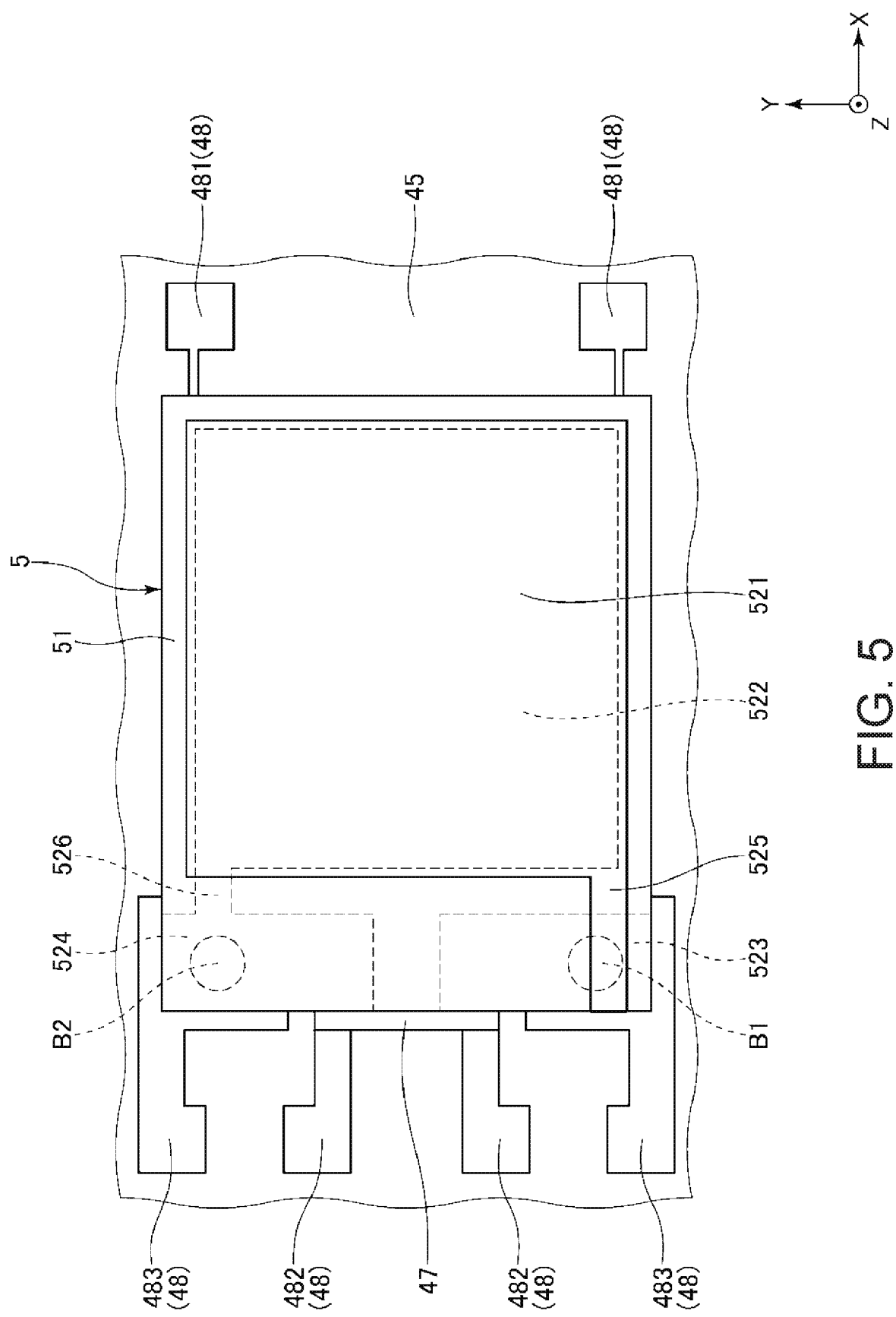
FIG. 5 is a plan view showing a vibration element.

FIG. 1 is a cross-sectional view showing a vibration device according to a first embodiment. FIG. 2 is a plan view showing a base. FIG. 3 is a cross-sectional view along line B-B in FIG. 2. FIG. 4 is a cross-sectional view along line C-C in FIG. 2. FIG. 5 is a plan view showing a vibration element. Note that FIG. 1 corresponds to a cross-section along line A-A in FIG. 2. For convenience of description, three axes orthogonal to each other are illustrated as an X-axis, a Y-axis, and a Z-axis. The tip of the arrow on the Z-axis will also be referred to as "up", and the base will also be referred to as "down". Also, the thickness direction of the base board, that is, a plan view along the Z-axis, will also be simply referred to as a "plan view".

A vibration device 1 shown in FIG. 1 is used as an oven controlled crystal vibrator (OCXO), for example. Such a vibration device 1 has a base 4 as a substrate, a lid 3 that is joined to the base 4, and a vibration element 5 that is housed within a space S that is formed between the base 4 and the lid 3.

First, the base 4 will be described. The base 4 has a tabular base board 41 having an upper surface 411 which is a first surface and a lower surface 412 which is a second surface located on the opposite side to the upper surface 411. Also, a heater 46, a temperature sensor 47 and a wiring 48 are disposed on the upper surface 411 side of the base board 41. Note that an insulating film 45 is disposed in the surface of the base board 41, and the base board 41, the heater 46, the temperature sensor 47 and the wiring 48 are electrically insulated by this insulating film 45. Such a base 4 is formed by a semiconductor process, for example. The base 4 can thereby be precisely formed. Note that, in this specification, in the case where a constituent element is described as being "disposed on the surface side", "located on the surface side" or the like, that element may be in direct contact with the surface or another element may be disposed therebetween.

Also, as shown in FIG. 2, the wiring 48 has a pair of first wirings 481 electrically connected to the heater 46, a pair of second wirings 482 electrically connected to the temperature sensor 47, and a pair of third wirings 483 electrically connected to the vibration element 5.

The base board 41 is a semiconductor substrate and, in particular, is a silicon substrate in this embodiment. Also, the insulating film 45 is constituted by silicon oxide. The insulating film 45 can be formed by thermally oxidizing the base board 41, for example. A denser insulating film 45 is thereby obtained. Also, the heater 46 is formed by a resistor made from ITO (indium tin oxide), and heat is generated by conduction and the amount of heat can be adjusted by adjusting the current flowing to the resistor. Also, the temperature sensor 47 is constituted by platinum, and detects temperature based on the characteristic of resistance changing depending on temperature. Also, the wiring 48 is constituted by aluminum. However, the configuration of these parts is not particularly limited as long as the respective functions thereof can be exhibited. For example, the base board 41 may be a semiconductor substrate other than a silicon substrate, such as a substrate constituted by germanium, gallium arsenide, gallium arsenide phosphide, gallium nitride or silicon carbide, for example.

The insulating film 45 also functions as a thermal insulation layer that suppresses external emission of heat from the heater 46 via the base board 41. Thus, the vibration element 5 can be more easily kept at a constant temperature, and power consumption of the heater 46 can be reduced. In order to make such effects more marked, a thicker insulating film 45 may be constituted by, for example, additionally layering an insulating film 45 formed by CVD (Chemical Vapor Deposition) on the upper surface 411 side, after forming the insulating film 45 by thermal oxidation.

Next, the lid 3 will be described. The lid 3, as shown in FIG. 1, has a tabular base board 31 having a lower surface 311 which is a third surface and an upper surface 312 which is a fourth surface located on the opposite side to the lower surface 311, a circuit 32 that is provided on the upper surface 312, a terminal 33 that is disposed on the lower surface 311, and a through electrode 34 that passes through the base board 31 in the thickness direction and electrically connects the terminal 33 and the circuit 32. An insulating film 35 is disposed on the surface of the base board 31, and the base board 31, the terminal 33 and the through electrode 34 are electrically insulated by this insulating film 35. Such a lid 3 is formed by a semiconductor process, for example. The lid 3 can thereby be precisely formed.

Also, the base board 31 has a recess 313 that opens in the lower surface 311. The opening of this recess 313 is closed by the base 4, and an airtight space S is thereby formed between the base 4 and the lid 3. The vibration element 5 is housed in this space S. The space S is in a depressurized state, and may be in a state closely approaching a vacuum. The vibration characteristics of the vibration element 5 are thereby enhanced. The atmosphere of the space S is, however, not particularly limited, and, for example, may be an atmosphere filled with an inert gas such as nitrogen or argon, or may be at atmospheric pressure or in a pressurized state rather than being in a depressurized state.

The base board 31 is a silicon substrate. Also, the terminal 33 and the through electrode 34 are constituted by aluminum. Also, the insulating film 35 is constituted by silicon oxide. The insulating film 35 can be formed by thermally oxidizing the base board 31, for example. A more precise insulating film 35 is thereby obtained. The configuration of these parts is, however, not particularly limited as long as the respective functions thereof can be exhibited. For example, the base board 31 may be a semiconductor substrate other than a silicon substrate, such as a substrate constituted by germanium, gallium arsenide, gallium arsenide phosphide, gallium nitride or silicon carbide, for example.

The insulating film 35 also functions as a thermal insulation layer that suppresses external emission of heat from the heater 46 via the base board 31. Thus, the vibration element 5 can be more easily kept at a constant temperature, and power consumption of the heater 46 can be reduced. In order to make such effects more marked, a thicker insulating film 35 may be constituted by, for example, additionally layering an insulating film 35 formed by CVD on the lower surface 311 side, after forming the insulating film 35 by thermal oxidation.

The circuit 32, as shown in FIG. 1, has a plurality of active devices (not shown) such as transistors, diodes, resistors and capacitors that are formed on the base board 31 by doping the base board 31 from the upper surface 312 side with impurities such as phosphorus, boron and arsenic, a wiring 323 that is laminated on the upper surface 312, an insulating film 324 that is laminated on the insulating film 35 so as to cover the wiring 323, a wiring 325 that is laminated on the insulating film 324 and electrically connected to the wiring 323, and an insulating film 326 that is laminated on the insulating film 324 so as to cover the wiring 325. The active devices (not shown) are electrically connected to each other via the wirings 323 and 325. The configuration of the circuit 32 is, however, not particularly limited as long as the function thereof can be exhibited.

Also, a passivation film 327 serving as an insulating layer is disposed on the insulating film 326, and a plurality of external terminals 328 that are electrically connected to the wiring 325 are disposed on the passivation film 327.

In this way, by creating the circuit 32 inside the lid 3, and, specifically, by forming the active devices of the circuit 32 on the base board 31 and integrating the lid 3 and the circuit 32, the vibration device 1 can be miniaturized, and, in particular, can be reduced in profile, compared with a configuration in which the circuit 32 is disposed separately, as was the case heretofore. Also, the passivation film 327 functions as a thermal insulation layer, and is able to effectively suppress external emission of heat from the vibration element 5 via the lid 3. Thus, the vibration element 5 can be more easily kept at a constant temperature, and power consumption of the heater 46 can be reduced. The constituent material of the passivation film 327 is not particularly limited, and polyimide, for example, can be used.

Note that, in this embodiment, the passivation film 327 covers only the circuit 32, although the present disclosure is not limited thereto, and, for example, the passivation film may cover the side surface of the lid 3, may further may cover the side surface of the base 4, and may further cover the lower surface of the base 4.

As shown in FIG. 1, the circuit 32 has an oscillation circuit 32A, a temperature compensation circuit 32B, and a temperature control circuit 32C. The oscillation circuit 32A is electrically connected to the vibration element 5, and oscillates the vibration element 5, by amplifying the output signal of the vibration element 5 and feeding back the amplified signal to the vibration element 5. The temperature compensation circuit 32B performs temperature compensation such that frequency variation of the oscillation signal of the oscillation circuit 32A is smaller than the frequency temperature characteristics of the vibration element 5 itself, based on temperature information output by the temperature sensor 47. Excellent temperature characteristics can thereby be exhibited. Note that the temperature compensation circuit 32B may be, for example, a circuit that adjusts the oscillation frequency of the oscillation circuit 32A by adjusting the capacitance of a variable capacitance circuit connected to the oscillation circuit 32A, or a circuit that adjusts the frequency of the output signal of the oscillation circuit 32A with a PLL (Phase Locked Loop) circuit or a direct digital synthesizer circuit.

The temperature control circuit 32C is a circuit for keeping the vibration element 5 at a constant temperature, by controlling the amount of current flowing through the heater 46 based on the temperature information output by the temperature sensor 47. For example, the temperature control circuit 32C sends a desired current to the heater 46, in the case where the current temperature determined from the output signal of the temperature sensor 47 is lower than a set reference temperature, and performs control such that current does not flow to the heater 46, in the case where the current temperature is not lower than the reference temperature. Also, for example, the temperature control circuit 32C may perform control to vary the amount of current flowing through the heater 46, according to the difference between the current temperature and the reference temperature. Here, the temperature sensor 47 serves as both a temperature sensor for the temperature compensation circuit 32B and a temperature sensor for the temperature control circuit 32C. Thus, the number of components is reduced, and the vibration device 1 can be miniaturized. The present disclosure is, however, not limited thereto, and the temperature sensor for the temperature compensation circuit 32B may be provided separately from the temperature sensor for the temperature control circuit 32C.

As shown in FIG. 1, such a lid 3 is directly joined at the lower surface 311 of the base board 31 to the upper surface 411 of the base board 41 via a joining member 6. In this embodiment, the base boards 31 and 41 are joined using diffusion bonding that utilizes the diffusion of the metals of the base boards. The joining method of the lid 3 and the base 4 is, however, not particularly limited.

As shown in FIGS. 3 and 4, the terminal 33 has a first terminal 331 that is electrically connected to the first wirings 481, a second terminal 332 that is electrically connected to the second wirings 482, and a third terminal 333 that is electrically connected to the third wirings 483. Also, the through electrode 34 has a first through electrode 341 that electrically connects the first terminal 331 and the circuit 32, a second through electrode 342 that electrically connects the second terminal 332 and the circuit 32, and a third through electrode 343 that electrically connects the third terminal 333 and the circuit 32. Thus, the heater 46 is electrically connected to the circuit 32 via the first through electrode 341, the temperature sensor 47 is electrically connected to the circuit 32 via the second through electrode 342, and the vibration element 5 is electrically connected to the circuit 32 via the third through electrode 343. Note that, more specifically, the first through electrode 341 is connected to the first terminal 331 and the temperature control circuit 32C, the second through electrode 342 is connected to the second terminal 332, the temperature control circuit 32C and the temperature compensation circuit 32B, and the third through electrode 343 is connected to the third terminal 333 and the oscillation circuit 32A. In this way, the electrical connection of the heater 46, the temperature sensor 47 and the vibration element 5 with the circuit 32 is facilitated by using the first, second and third through electrodes 341, 342 and 343. Also, wiring does not need to be routed outside the lid 3 from inside the space S, in order to electrically connect the heater 46, the temperature sensor 47 and the vibration element 5 to the circuit 32. Thus, the airtightness of the space S can be more reliably secured.

Next, the vibration element 5 will be described. The vibration element 5 is disposed on the upper surface 411 side of the base 4. Also, the vibration element 5 is disposed away from the upper surface 411 on the Z-axis plus side. This vibration element 5 is an SC cut quartz crystal vibration element. A vibration element 5 with excellent frequency stability is thereby obtained. As shown in FIG. 5, the vibration element 5 has a SC cut tabular quartz crystal board 51 that is rectangular in plan view, and an electrode provided on the surface of the quartz crystal board 51. Also, the electrode has an excitation electrode 521 that is disposed on the upper surface of the quartz crystal board 51, and an excitation electrode 522 that is disposed on the lower surface opposing the excitation electrode 521 via the quartz crystal board 51. Also, the electrode has a wiring 525 that electrically connects a pair of terminals 523 and 524 disposed on the lower surface of the quartz crystal board 51 to the terminal 523 and the excitation electrode 521, and a wiring 526 that electrically connects the terminal 524 and the excitation electrode 522.

The configuration of the vibration element 5 is, however, not limited thereto. For example, the shape of the quartz crystal board 51 in plan view is not limited to being rectangular, and may be circular, for example. Also, the vibration element 5 may be an AT cut quartz crystal vibration element, a BT cut quartz crystal vibration element, a tuning fork type quartz crystal vibration element, a surface acoustic wave resonator, another type of piezoelectric vibration element, a MEMS (Microelectromechanical Systems) resonant device, or the like.

Such a vibration element 5 is fixed to the base 4 via conductive joining members B1 and B2. Also, the conductive joining member B1 contacts one of the third wirings 483 and the terminal 523, and is electrically connected thereto. Similarly, the conductive joining member B2 contacts the other of the third wirings 483 and the terminal 524, and is electrically connected thereto.

The conductive joining members B1 and B2 are not particularly limited as long as conductivity and bondability are both provided, and, for example, various metal bumps such as a gold bump, a silver bump, a copper bump and a solder bump, and a conductive adhesive obtained by dispersing a conductive filler such as a silver filler in various adhesives such as a polyimide adhesive, an epoxy adhesive, a silicone adhesive and an acrylic adhesive can be used. When a metal bump is used as the conductive joining members B1 and B2, the generation of gas from the conductive joining members B1 and B2 can be suppressed, and changes in the environment of the space S, particularly increases in pressure, can be effectively suppressed. On the other hand, when a conductive adhesive is used as the conductive joining members B1 and B2, the conductive joining members B1 and B2 will be soft compared with a metal bump, and stress will less likely be placed on the vibration element 5.

Here, returning to description of the base 4, the disposition of the heater 46 and the temperature sensor 47 relative to the vibration element 5 will be described. As shown in FIG. 2, in plan view, the heater 46 is disposed to overlap with the vibration element 5. In particular, in this embodiment, the heater 46 overlaps entirely with the vibration element 5. Planar expansion of the vibration device 1 is thereby suppressed, and miniaturization of the vibration device 1 can be achieved. The disposition of the heater 46 is, however, not particularly limited, and the heater 46 may be disposed to overlap partially with the vibration element 5, or the heater 46 and the vibration element 5 may not overlap.

Also, the temperature sensor 47, in plan view, is located between the conductive joining members B1 and B2. More specifically, the temperature sensor 47, in plan view, is disposed so as to overlap with a line segment connecting the centers of the conductive joining members B1 and B2. Since the heat of the heater 46 is conveyed to the vibration element 5 via the conductive joining members B1 and B2, the temperature of the vibration element 5 can be more accurately detected by the temperature sensor 47, by disposing the temperature sensor 47 between the conductive joining members B1 and B2. The disposition of the temperature sensor 47 is, however, not particularly limited.

The vibration device 1 is as described above. Such a vibration device 1 has, as aforementioned, a base 4 serving as a substrate that is provided with an upper surface 411 which is a first surface and a lower surface 412 which is a second surface located on the opposite side to the upper surface 411, a heater 46 that is provided on the upper surface 411 side of the base 4, a temperature sensor 47 that is provided on the upper surface 411 side of the base 4, a vibration element 5 that is disposed on the upper surface 411 side of the base 4, a lid 3 that is provided with an a lower surface 311 which is a third surface that is joined to the upper surface 411 side, and an upper surface 312 which is a fourth surface that is located on the opposite side to the lower surface 311, and a circuit 32 that is provided on the upper surface 312, and is provided with a temperature control circuit 32C that controls the heater 46 based on the output of the temperature sensor 47. In this way, by creating the circuit 32 inside the lid 3, and, specifically, by forming the active devices of the circuit 32 on the base board 31 and integrating the lid 3 and the circuit 32, the vibration device 1 can be miniaturized, and, in particular, can be reduced in profile, compared with a configuration in which the circuit 32 is disposed separately, as was the case heretofore.

Also, as aforementioned, the circuit 32 is provided on the upper surface 312 of the lid 3. The lid 3 has a first through electrode 341 that passes through the lower surface 311 and the upper surface 312, and electrically connects the heater 46 and the circuit 32, and a second through electrode 342 that passes through the lower surface 311 and the upper surface 312, and electrically connects the temperature sensor 47 and the circuit 32. In this way, the electrical connection of the heater 46 and the temperature sensor 47 with the circuit 32 is facilitated, by using the first and second through electrodes 341 and 342 that are provided inside the lid 3. Also, wiring does not need to be routed outside the lid 3 from inside the space S, in order to electrically connect the heater 46 and the temperature sensor 47 to the circuit 32. Thus, the airtightness of the space S can be more reliably secured.

Also, as aforementioned, the circuit 32 has an oscillation circuit 32A. The lid 3 has a third through electrode 343 that passes through the lower surface 311 and the upper surface 312, and electrically connects the vibration element 5 and the circuit 32. In this way, the electrical connection between the vibration element 5 and the circuit 32 is facilitated, by using the third through electrode 343 that is provided inside the lid 3. Also, wiring does not need to be routed outside the lid 3 from inside the space S, in order to electrically connect the vibration element 5 and the circuit 32. Thus, the airtightness of the space S can be more reliably secured.

Also, as aforementioned, the lid 3 has a passivation film 327 serving as an insulating layer that is provided on the upper surface 312 side of the lid 3, and covers the circuit 32. The circuit 32 can thereby be protected from dust, moisture, and the like. Furthermore, the passivation film 327 functions as a thermal insulation layer, and is able to effectively suppress external emission of heat from the vibration element 5 via the lid 3. Thus, the vibration element 5 can be more easily kept at a constant temperature, and power consumption of the heater 46 can be reduced.

Also, as aforementioned, the opening of the lid 3 has a recess 313 that opens in the lower surface 311 and houses the vibration element 5 on the inner side thereof, and an insulating film 35 serving as a thermal insulation layer that is disposed on the inner surface of the recess 313. Thus, the vibration element 5 can be more easily kept at a constant temperature, and power consumption of the heater 46 can be reduced.

Also, as aforementioned, the circuit 32 includes a temperature compensation circuit 32B that performs temperature compensation of the oscillation signal from the oscillation circuit 32A based on the output of the temperature sensor 47. The vibration device 1 is thereby able to exhibit excellent temperature characteristics.

Second Embodiment

Figure 6:
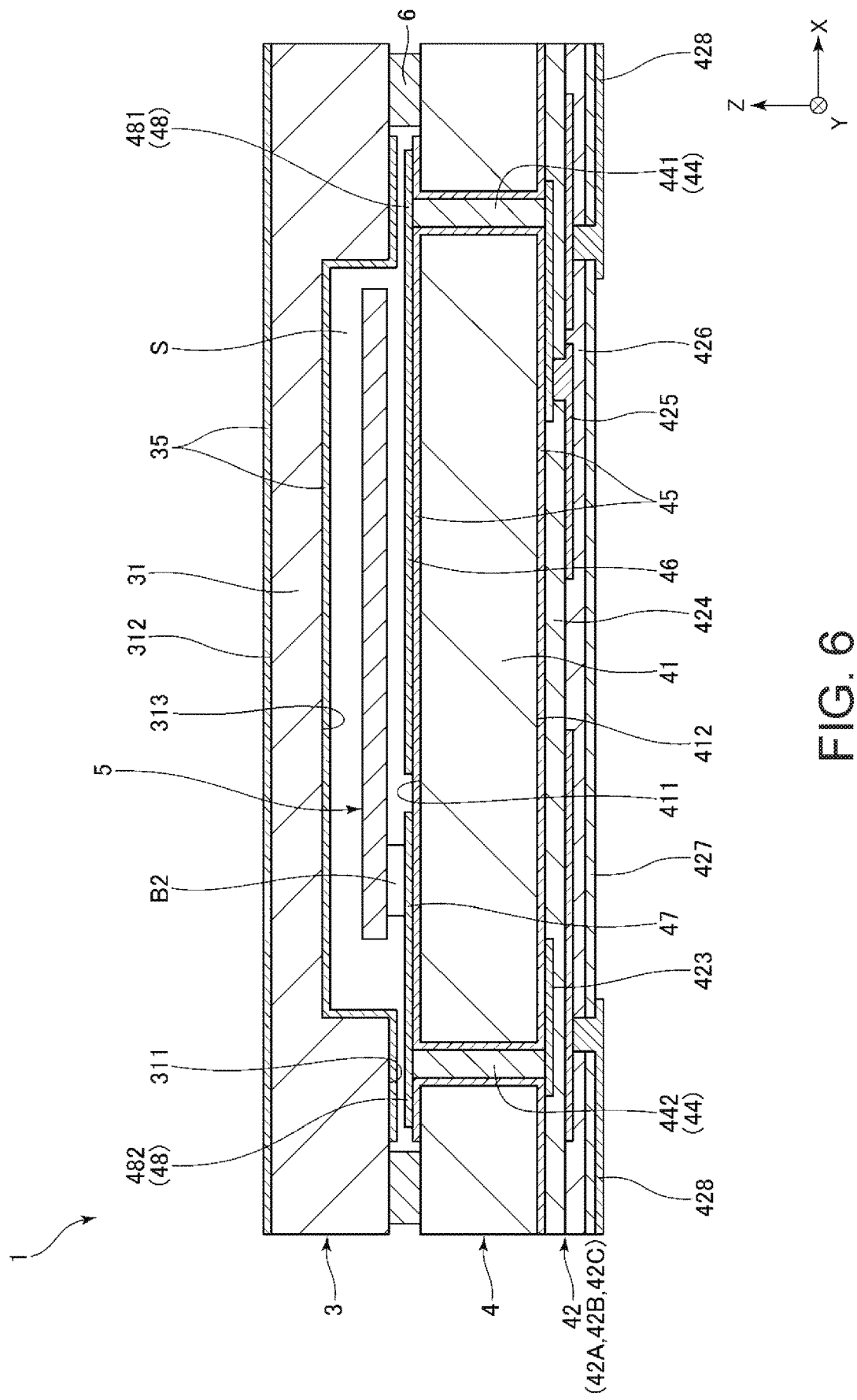
FIG. 6 is a cross-sectional view showing a vibration device according to a second embodiment.
Figure 7:
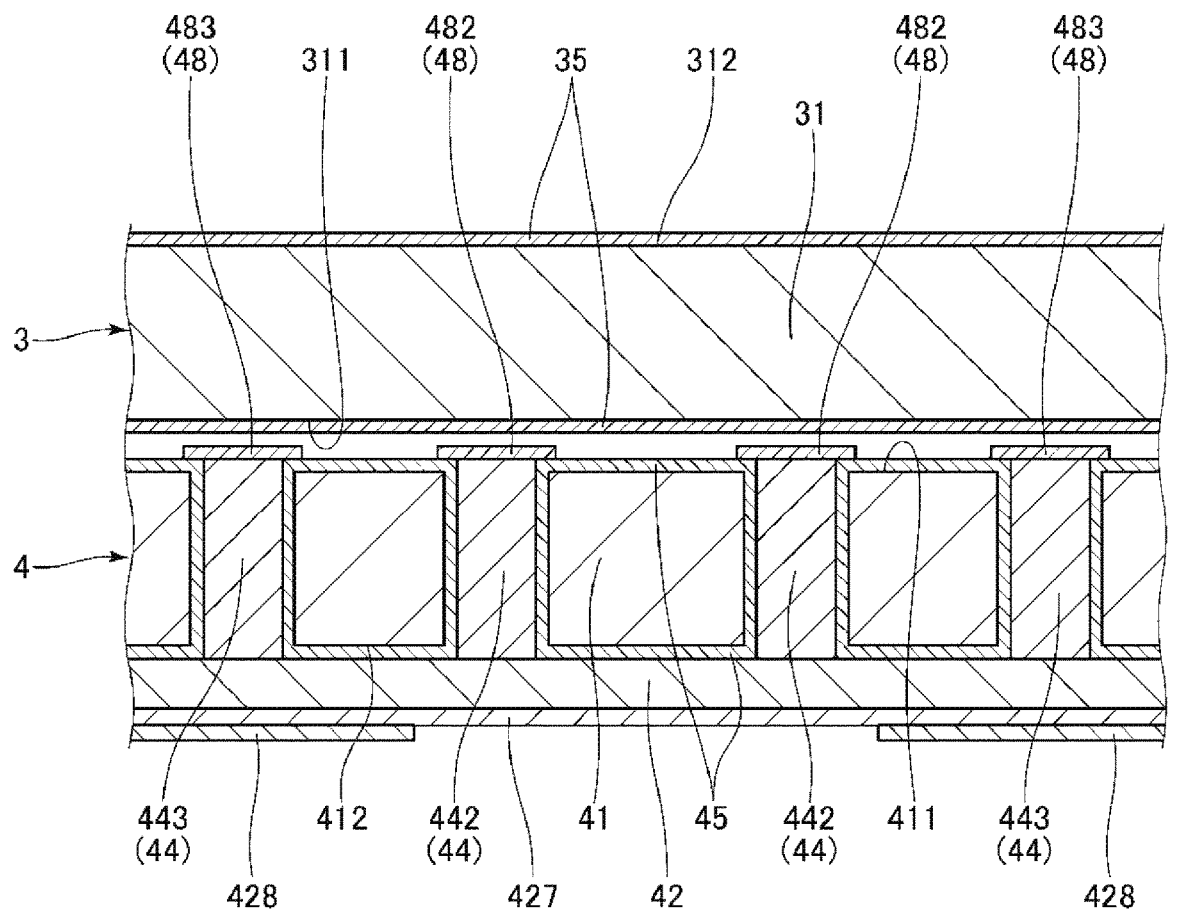
FIG. 7 is a cross-sectional view showing through electrodes provided in the vibration device of FIG. 6.
Figure 8:
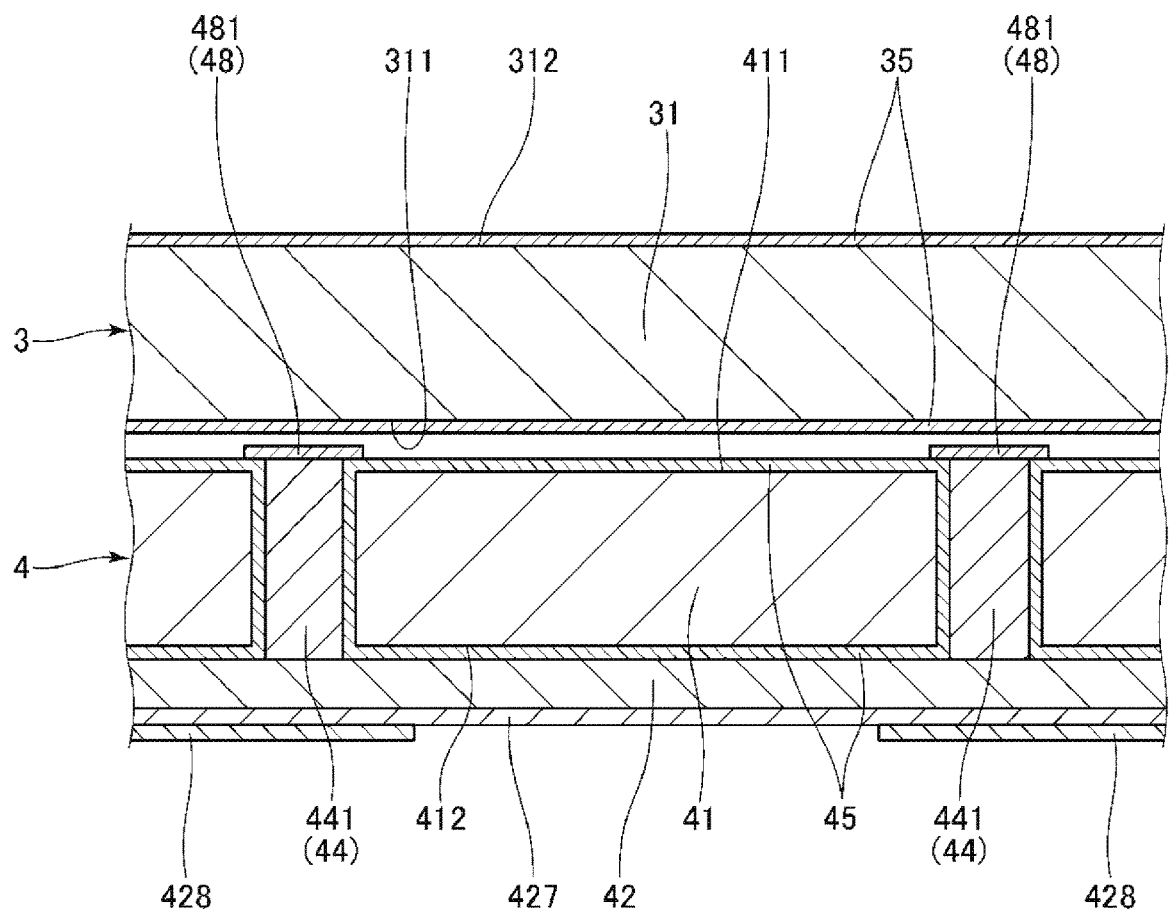
FIG. 8 is a cross-sectional view showing through electrodes provided in the vibration device of FIG. 6.

FIG. 6 is a cross-sectional view showing a vibration device according to a second embodiment. FIGS. 7 and 8 are cross-sectional views showing through electrodes provided in the vibration device of FIG. 6. Note that FIG. 7 corresponds to the cross-sectional view along line B-B in FIG. 2, and FIG. 8 corresponds to the cross-sectional view along line C-C in FIG. 2.

The vibration device 1 according to this embodiment is similar to the vibration device 1 of the aforementioned first embodiment, except for the circuit 42 being provided on the base 4. Note that, in the following description, the vibration device 1 of the second embodiment will be described focusing on the differences from the aforementioned first embodiment, and description of similar matters will be omitted. Also, in FIGS. 6 to 8, constituent elements similar to the aforementioned embodiment will be given the same reference signs.

As shown in FIG. 6, with the vibration device 1 of this embodiment, a circuit 42 is provided on a lower surface 412 of a base 4. The circuit 42 has a similar configuration to the circuit 32 of the aforementioned first embodiment, and has, for example, an oscillation circuit 42A, a temperature compensation circuit 42B, and a temperature control circuit 42C. Also, the base 4 has a through electrode 44 that passes through the base board 41 in the thickness direction and electrically connects the wiring 48 and the circuit 42.

The circuit 42 has a plurality of active devices (not shown) such as transistors, diodes, resistors and capacitors that are formed on the base board 41 by doping the base board 41 from the lower surface 412 side with impurities such as phosphide, boron and arsenic, a wiring 423 that is laminated on the lower surface 412, an insulating film 424 that is laminated on an insulating film 45 so as to cover the wiring 423, a wiring 425 that is laminated on the insulating film 424 and electrically connected to the wiring 423, and an insulating film 426 that is laminated on the insulating film 424 so as to cover the wiring 425. The active devices (not shown) are electrically connected to each other via the wirings 423 and 425. The configuration of the circuit 42 is, however, not particularly limited as long as the function thereof can be exhibited.

Also, a passivation film 427 serving as an insulating layer is disposed on the insulating film 426, and a plurality of terminals 428 that are electrically connected to the wiring 425 are disposed on the passivation film 427.

In this way, by creating the circuit 42 inside the base 4, and, more specifically, by forming the active devices of the circuit 42 on the base board 41 and integrating the base 4 and the circuit 42, the vibration device 1 can be miniaturized, and, in particular, can be reduced in profile, compared with a configuration in which the circuit 42 is disposed separately, as was the case heretofore. Also, the passivation film 427 functions as a thermal insulation layer, and is able to effectively suppress external emission of heat from the vibration element 5 via the base 4. Thus, the vibration element 5 can be more easily kept at a constant temperature, and power consumption of the heater 46 can be reduced.

As shown in FIGS. 7 and 8, the through electrode 44 has a first through electrode 441 that electrically connects first wirings 481 and the circuit 42, a second through electrode 442 that electrically connects second wirings 482 and the circuit 42, and a third through electrode 443 that electrically connects third wirings 483 and the circuit 42. Thus, the heater 46 is electrically connected to the circuit 42 via the first through electrode 441, a temperature sensor 47 is electrically connected to the circuit 42 via the second through electrode 442, and the vibration element 5 is electrically connected to the circuit 42 via the third through electrode 443. In this way, the electrical connection of the heater 46, the temperature sensor 47 and the vibration element 5 with the circuit 42 is facilitated, by using the first, second and third through electrodes 441, 442 and 443. Also, wiring does not need to be routed outside the base 4 from inside the space S, in order to electrically connect the heater 46, the temperature sensor 47 and the vibration element 5 to the circuit 42. Thus, the airtightness of the space S can be more reliably secured.

As described above, the vibration device 1 of this embodiment has a base 4 serving as a substrate that is provided with an upper surface 411 which is a first surface and a lower surface 412 which is a second surface that is located on the opposite side to the upper surface 411, a heater 46 that is provided on the upper surface 411 side of the base 4, a temperature sensor 47 that is provided on the upper surface 411 side of the base 4, a vibration element 5 that is disposed on the upper surface 411 side of the base 4, a lid 3 that is provided with a lower surface 311 which is a third surface that is connected to the upper surface 411 side and an upper surface 312 which is a fourth surface that is located on the opposite side to the lower surface 311, and a circuit 42 that is provided on the lower surface 412 and is provided with a temperature control circuit 42C that controls the heater 46 based on the output of the temperature sensor 47. In this way, by creating the circuit 42 inside the base 4, and, specifically, by forming the active devices of the circuit 42 on the base board 41 and integrating the base 4 and the circuit 42, the vibration device 1 can be miniaturized, and, in particular, can be reduced in profile, compared with a configuration in which the circuit 42 is disposed separately, as was the case heretofore.

Also, as aforementioned, the circuit 42 is provided on the lower surface 412. The base 4 has a first through electrode 441 that passes through the upper surface 411 and the lower surface 412, and electrically connects the heater 46 and the circuit 42, and a second through electrode 442 that passes through the upper surface 411 and the lower surface 412, and electrically connects the temperature sensor 47 and the circuit 42. The electrical connection of the heater 46 and the temperature sensor 47 with the circuit 42 is thereby facilitated. Also, wiring does not need to be routed outside the base 4 from inside the space S, in order to electrically connect the heater 46 and the temperature sensor 47 to the circuit 42. Thus, the airtightness of the space S can be more reliably secured.

Also, as aforementioned, the circuit 42 has an oscillation circuit 42A, and the base 4 has a third through electrode 443 that passes through the upper surface 411 and the lower surface 412, and electrically connects the vibration element 5 and the circuit 42. The electrical connection between the vibration element 5 and the circuit 42 is thereby facilitated. Also, wiring does not need to be routed outside the base 4 from inside the space S, in order to electrically connect the vibration element 5 and the circuit 42. Thus, the airtightness of the space S can be more reliably secured.

Also, as aforementioned, the base 4 has a passivation film 427 serving as an insulating layer that is provided on the lower surface 412 side of the base 4, and covers the circuit 42. External emission of heat from the vibration element 5 via the base 4 can thereby be effectively suppressed. Thus, the vibration element 5 can be more easily kept at a constant temperature, and power consumption of the heater 46 can be reduced.

According to the second embodiment as described, similar effects to the aforementioned first embodiment can be exhibited.

Third Embodiment

Figure 9:
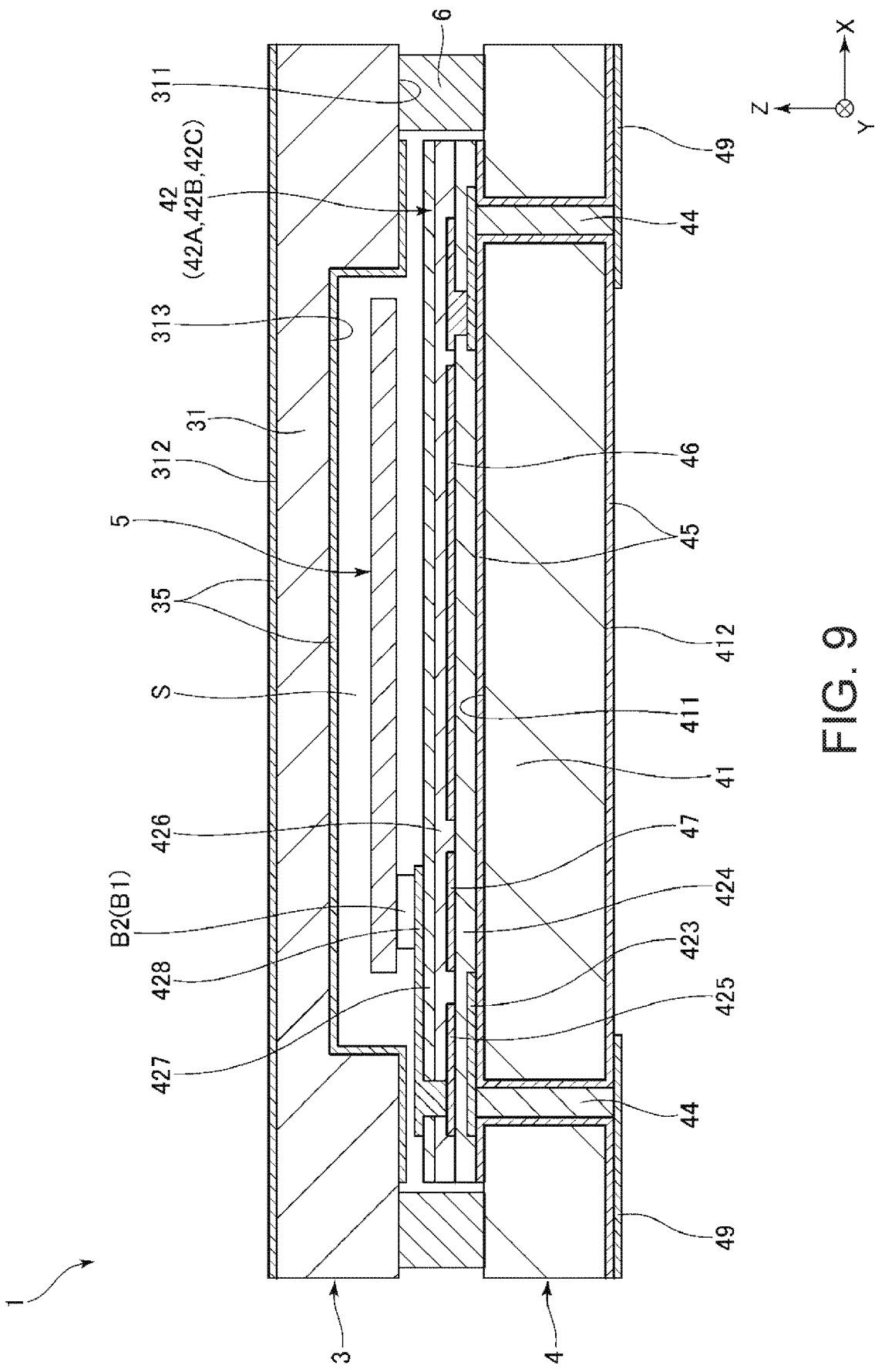
FIG. 9 is a cross-sectional view showing a vibration device according to a third embodiment.

FIG. 9 is a cross-sectional view showing a vibration device according to a third embodiment.

A vibration device 1 according to this embodiment is similar to the vibration device 1 of the aforementioned first embodiment, except for the circuit 42 being provided on the base 4. Note that, in the following description, the vibration device 1 of the third embodiment will be described focusing on the differences from the aforementioned first embodiment, and description of similar matters will be omitted. Also, in FIG. 9, constituent elements similar to the aforementioned embodiment will be given the same reference signs.

As shown in FIG. 9, in the vibration device 1 of this embodiment, a circuit 42 is provided on an upper surface 411 of a base 4. The circuit 42 has a similar configuration to the circuit 32 of the aforementioned first embodiment, and has an oscillation circuit 42A, a temperature compensation circuit 42B, and a temperature control circuit 42C. A plurality of external terminals 49 are disposed on a lower surface 412 of the base 4, and these external terminals 49 are electrically connected to the circuit 42 via a through electrode 44 that has passes through a base board 41 in the thickness direction.

The circuit 42 has a plurality of active devices (not shown) such as transistors, diodes, resistors and capacitors that are formed on the base board 41 by doping the base board 41 from the upper surface 411 side with impurities such as phosphide, boron and arsenic, a wiring 423 that is laminated on the upper surface 411, an insulating film 424 that is laminated on an insulating film 45 so as to cover the wiring 423, a wiring 425 that is laminated on the insulating film 424 and electrically connected to the wiring 423, and an insulating film 426 that is laminated on the insulating film 424 so as to cover the wiring 425. The active devices (not shown) are electrically connected to each other via the wirings 423 and 425. The configuration of the circuit 42 is, however, not particularly limited as long as the function thereof can be exhibited.

Also, a passivation film 427 serving as an insulating layer is disposed on the insulating film 426, and a plurality of terminals 428 that are electrically connected to the wiring 425 are disposed on the passivation film 427. A vibration element 5 is joined to these terminals 428 via conductive joining members B1 and B2. Also, a heater 46 and a temperature sensor 47 are formed inside the circuit 42. In other words, the heater 46 and a temperature sensor 47 are integrally formed with the circuit 42. In the illustrated configuration, the heater 46 and the temperature sensor 47 are constituted as part of the wiring 425. The disclosure is, however, not limited thereto, and, for example, the heater 46 and the temperature sensor 47 may be constituted separately from the circuit 42, and disposed on the passivation film 427.

As described above, the vibration device 1 of this embodiment has a base 4 serving as a substrate that is provided with an upper surface 411 which is a first surface and a lower surface 412 which is a second surface that is located on the opposite side to the upper surface 411, a heater 46 that is provided on the upper surface 411 side of the base 4, a temperature sensor 47 that is provided on the upper surface 411 side of the base 4, a vibration element 5 that is disposed on the upper surface 411 side of the base 4, a lid 3 that is provided with a lower surface 311 which is a third surface that is connected to the upper surface 411 side and an upper surface 312 which is a fourth surface that is located on the opposite side to the lower surface 311, and a circuit 42 that is provided on the upper surface 411 and is provided with a temperature control circuit 42C that controls the heater 46 based on the output of the temperature sensor 47. In this way, by creating the circuit 42 inside the base 4, and, specifically, by forming the active devices of the circuit 42 on the base board 41 and integrating the base 4 and the circuit 42, the vibration device 1 can be miniaturized, and, in particular, can be reduced in profile, compared with a configuration in which the circuit 42 is disposed separately, as was the case heretofore.

According to the third embodiment as described above, similar effects to the aforementioned first embodiment can be exhibited.

Fourth Embodiment

Figure 10:
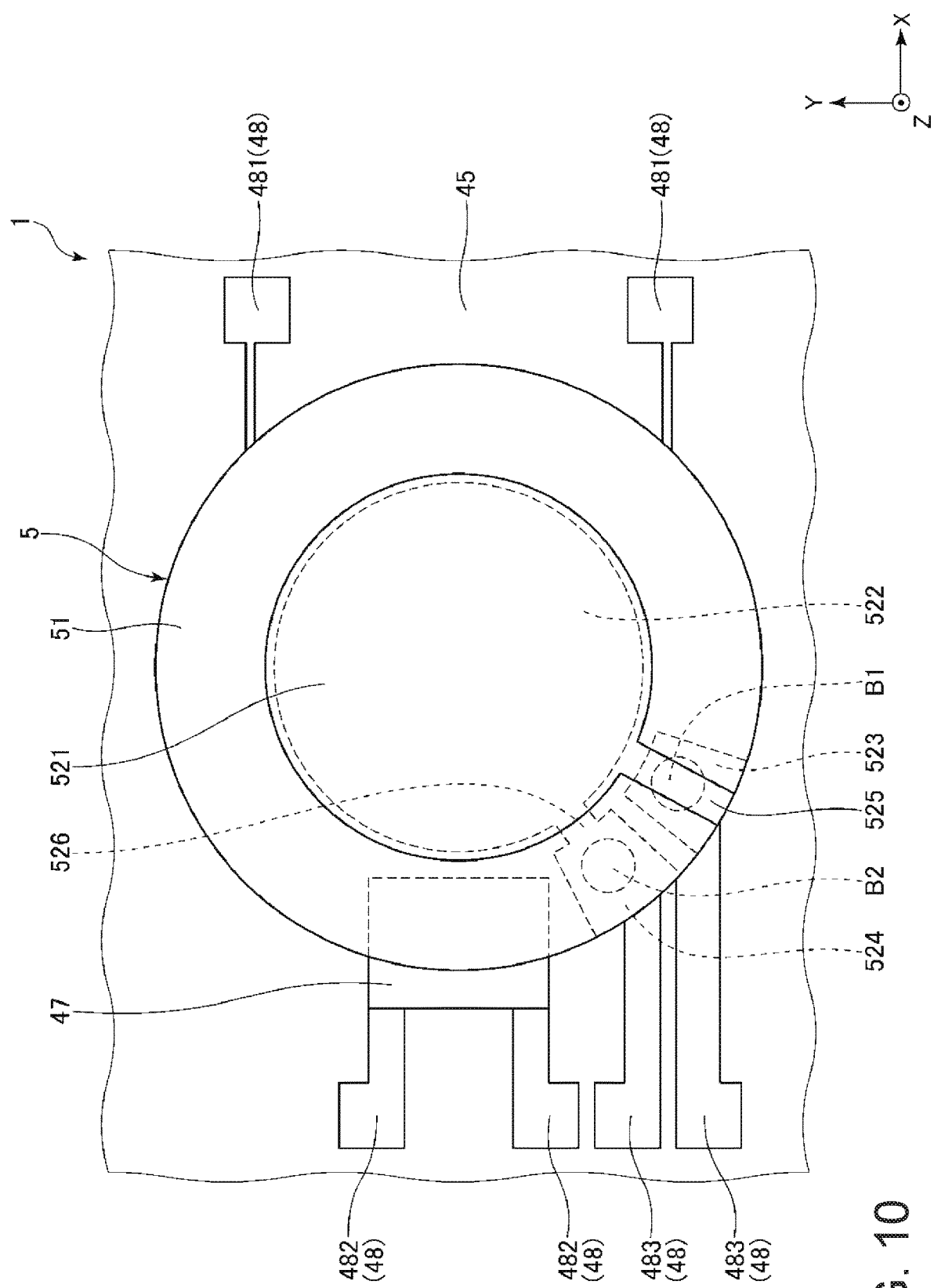
FIG. 10 is a plan view showing a vibration element provided in a vibration device according to a fourth embodiment.

FIG. 10 is a plan view showing a vibration element provided in a vibration device according to a fourth embodiment.

A vibration device 1 according to this embodiment is similar to the vibration device 1 of the aforementioned first embodiment, except for the shape of the vibration element 5 differing. Note that, in the following description, the vibration device 1 of the fourth embodiment will be described focusing on the differences from the aforementioned first embodiment, and description of similar matters will be omitted. Also, in FIG. 10, constituent elements similar to the aforementioned embodiment will be given the same reference signs.

As shown in FIG. 10, in the vibration device 1 of this embodiment, a quartz crystal board 51 of a vibration element 5 is circular in plan view. Also, conductive joining members B1 and B2 are adjacently disposed, and a temperature sensor 47 is disposed near these conductive joining members B1 and B2.

Also according to the fourth embodiment as described above, similar effects to the aforementioned first embodiment can be exhibited. Note that the circular vibration element 5 in this embodiment is also applicable to the aforementioned second or third embodiment.

Although a vibration device of the present disclosure has been described above based on illustrated embodiments, the disclosure is not particularly limited thereto, and the configurations of the constituent elements can be replaced by elements of any configuration having similar functions. Any other suitable constituent elements may also be added. Also, the embodiments may be combined as appropriate.

What is claimed is:

1. A vibration device comprising:
   a substrate provided with a first surface and a second surface located on an opposite side to the first surface;
   a heater provided on the first surface side of the substrate;
   a temperature sensor provided on the first surface side of the substrate;
   a vibration element disposed on the first surface side of the substrate;
   a lid provided with a third surface joined on the first surface side, and a fourth surface located on an opposite side to the third surface; and
   a circuit provided on the fourth surface and including a temperature control circuit configured to control the heater based on an output of the temperature sensor,
   wherein the lid has a first through electrode passing through the third surface and the fourth surface, and electrically connecting the heater and the circuit, and a second through electrode passing through the third surface and the fourth surface, and electrically connecting the temperature sensor and the circuit.

2. The vibration device according to claim 1,
   wherein the circuit has an oscillation circuit, and
   the lid has a third through electrode passing through the third surface and the fourth surface, and electrically connecting the vibration element and the circuit.

3. The vibration device according to claim 1, comprising:
   an insulating layer provided on the fourth surface side of the lid, and covering the circuit.

4. A vibration device comprising:
   a substrate provided with a first surface and a second surface located on an opposite side to the first surface;
   a heater provided on the first surface side of the substrate;
   a temperature sensor provided on the first surface side of the substrate;
   a vibration element disposed on the first surface side of the substrate;

a lid provided with a third surface joined on the first surface side, and a fourth surface located on an opposite side to the third surface; and a circuit provided on the second surface and including a temperature control circuit configured to control the heater based on an output of the temperature sensor, wherein the substrate has a first through electrode passing through the first surface and the second surface, and electrically connecting the heater and the circuit, and a second through electrode passing through the first surface and the second surface, and electrically connecting the temperature sensor and the circuit.

5. The vibration device according to claim 4, wherein the circuit has an oscillation circuit, and the substrate has a third through electrode passing through the first surface and the second surface, and electrically connecting the vibration element and the circuit.

6. The vibration device according to claim 4, comprising:

an insulating layer provided on the second surface side of the substrate, and covering the circuit.

7. The vibration device according to claim 2, wherein the circuit includes a temperature compensation circuit configured to perform temperature compensation of an oscillation signal from the oscillation circuit based on the output of the temperature sensor.

* * * * *